(12) United States Patent
Yu et al.

(10) Patent No.: US 10,043,778 B2
(45) Date of Patent: Aug. 7, 2018

(54) METHODS OF PACKAGING SEMICONDUCTOR DEVICES AND PACKAGED SEMICONDUCTOR DEVICES

(71) Applicant: Taiwan Semiconductor Manufacturing Company, Ltd., Hsinchu (TW)

(72) Inventors: Chen-Hua Yu, Hsinchu (TW); Chung-Shi Liu, Hsinchu (TW); Meng-Tse Chen, Changzhi Township (TW); Hui-Min Huang, Taoyuan (TW); Chih-Fan Huang, Kaohsiung (TW); Ming-Da Cheng, Jhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/843,507

(22) Filed: Dec. 15, 2017

(65) Prior Publication Data
US 2018/0108637 A1    Apr. 19, 2018

Related U.S. Application Data

(62) Division of application No. 14/326,228, filed on Jul. 8, 2014, now Pat. No. 9,847,317.

(51) Int. Cl.
*H01L 25/065* (2006.01)
*H01L 21/3105* (2006.01)
(Continued)

(52) U.S. Cl.
CPC .... *H01L 25/0655* (2013.01); *H01L 21/31053* (2013.01); *H01L 21/6835* (2013.01);
(Continued)

(58) Field of Classification Search
CPC ... H01L 25/0655; H01L 23/585; H01L 24/96; H01L 21/6835; H01L 21/565; H01L 21/78; H01L 23/564; H01L 23/3107; H01L 21/31053; H01L 21/768; H01L 23/528; H01L 24/02; H01L 25/50; H01L 2224/02379; H01L 2221/68327;
(Continued)

(56) References Cited

U.S. PATENT DOCUMENTS 5,583,378 A  * 12/1996  Marrs ..................... H01L 24/97
                                                      257/710
5,866,953 A  *  2/1999  Akram .................. H01L 21/563
                                                      257/687
(Continued)

FOREIGN PATENT DOCUMENTS

CN    101996894 A      3/2011
JP     59036932 A  *  2/1984
(Continued)

*Primary Examiner* — Ermias Woldegeorgis
(74) *Attorney, Agent, or Firm* — Slater Matsil, LLP

(57) ABSTRACT

Methods of packaging semiconductor devices and packaged semiconductor devices are disclosed. In some embodiments, a method of packaging a semiconductor device includes forming a dam structure on dies proximate edge regions of the dies. A molding material is disposed around the dies, and a top portion of the molding material and a top portion of the dam structure are removed.

20 Claims, 12 Drawing Sheets

(51) Int. Cl.
    *H01L 25/00*     (2006.01)
    *H01L 23/00*     (2006.01)
    *H01L 23/58*     (2006.01)
    *H01L 23/538*     (2006.01)
    *H01L 23/528*     (2006.01)
    *H01L 23/31*     (2006.01)
    *H01L 21/78*     (2006.01)
    *H01L 21/768*     (2006.01)
    *H01L 21/683*     (2006.01)
    *H01L 23/498*     (2006.01)
    *H01L 23/15*     (2006.01)
    *H01L 21/56*     (2006.01)

(52) U.S. Cl.
    CPC ............ *H01L 21/768* (2013.01); *H01L 21/78* (2013.01); *H01L 23/3107* (2013.01); *H01L 23/3128* (2013.01); *H01L 23/49822* (2013.01); *H01L 23/49894* (2013.01); *H01L 23/528* (2013.01); *H01L 23/5389* (2013.01); *H01L 23/564* (2013.01); *H01L 23/585* (2013.01); *H01L 24/02* (2013.01); *H01L 24/19* (2013.01); *H01L 24/20* (2013.01); *H01L 24/96* (2013.01); *H01L 24/97* (2013.01); *H01L 25/50* (2013.01); H01L 21/561 (2013.01); H01L 21/565 (2013.01); H01L 21/568 (2013.01); H01L 23/15 (2013.01); H01L 23/49816 (2013.01); H01L 2221/68327 (2013.01); H01L 2221/68359 (2013.01); H01L 2221/68372 (2013.01); H01L 2224/0231 (2013.01); H01L 2224/02379 (2013.01); H01L 2224/04105 (2013.01); H01L 2224/12105 (2013.01); H01L 2924/14 (2013.01); H01L 2924/1431 (2013.01); H01L 2924/1434 (2013.01); H01L 2924/18162 (2013.01)

(58) Field of Classification Search
    CPC ... H01L 2221/68359; H01L 2224/0231; H01L 2924/14
    See application file for complete search history.

(56) References Cited

U.S. PATENT DOCUMENTS

| | | | |
|---|---|---|---|
| 6,818,989 B2 | 11/2004 | Higuchi et al. | |
| 2002/0008315 A1 | 1/2002 | Park | |
| 2008/0136004 A1 | 6/2008 | Yang et al. | |
| 2011/0260336 A1 | 10/2011 | Kang et al. | |
| 2011/0309488 A1* | 12/2011 | Pagaila | H01L 21/561 257/692 |
| 2012/0142165 A1* | 6/2012 | Huang | H01L 21/561 438/462 |
| 2012/0153462 A1* | 6/2012 | Wakiyama | H01L 21/563 257/737 |
| 2013/0164867 A1* | 6/2013 | Ramasamy | H01L 27/14618 438/25 |
| 2014/0103488 A1 | 4/2014 | Chen et al. | |

FOREIGN PATENT DOCUMENTS

| | | |
|---|---|---|
| JP | 359036932 A | 2/1984 |
| JP | 04093051 A | 3/1992 |
| JP | 2002343902 A | 11/2002 |
| KR | 20020009087 A | 2/2002 |

\* cited by examiner

METHODS OF PACKAGING SEMICONDUCTOR DEVICES AND PACKAGED SEMICONDUCTOR DEVICES

CROSS-REFERENCE TO RELATED APPLICATION

This application is a divisional of U.S. patent application Ser. No. 14/326,228, filed Jul. 8, 2014, and entitled "Methods of Packaging Semiconductor Devices and Packaged Semiconductor Devices," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications. Chip scale packaging (CSP) is one type of smaller packaging technique.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
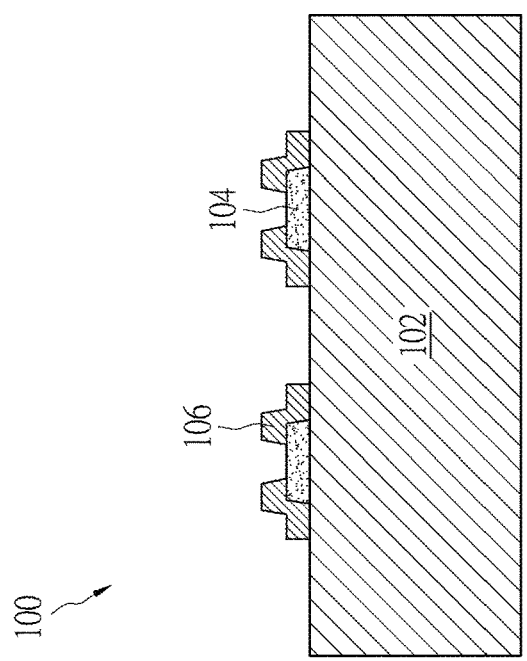
FIGS. 1A and 1B are cross-sectional views of integrated circuit dies that will be packaged in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel methods of packaging semiconductor devices and structures thereof, wherein a dam structure is formed proximate edge regions of an integrated circuit die prior to forming a molding material around the die. The dam structure ensures that a sufficient amount of the molding material will be applied around the die, which improves the formation of a subsequent interconnect structure.

Figure 1A:
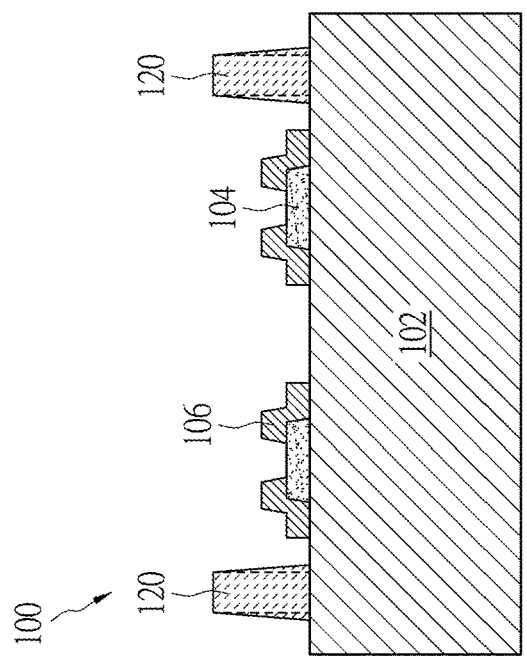

FIG. 1A is a cross-sectional view of a semiconductor device that will be packaged in accordance with some embodiments of the present disclosure. To package the semiconductor device, first, the semiconductor device is provided. The semiconductor device includes an integrated circuit die 100. The integrated circuit die 100 may be previously fabricated on a semiconductor wafer, and the wafer is singulated or diced to form a plurality of the integrated circuit dies 100, for example. The integrated circuit die 100 includes a substrate 102 comprising a semi-conductive material and that includes circuitry, components, wiring, and other elements (not shown) fabricated within and/or thereon. The integrated circuit die 100 is adapted to perform a predetermined function or functions, such as logic, memory, processing, other functions, or combinations thereof, as example. The integrated circuit die 100 is also referred to herein as a die 100.

The die 100 includes a plurality of contact pads 104 formed across a top surface thereof. The plurality of contact pads 104 are disposed on a surface of the substrate 102. The contact pads 104 are electrically coupled to portions of the substrate 102. The contact pads 104 comprise a conductive material such as copper, aluminum, other metals, or alloys or multiple layers thereof, as examples. Alternatively, the contact pads 104 may comprise other materials.

An insulating material 106 is disposed over exposed top surfaces of the integrated circuit die 100 and over portions of the contact pads 104. The insulating material 106 may comprise one or more insulating material layers, such as silicon dioxide, silicon nitride, a polymer material, or other materials. The insulating material 106 is patterned using a photolithography process or other process to form openings over a top surface of the contact pads 104, so that electrical connection can be made to the contact pads 104. The insulating material 106 comprises a passivation layer in some embodiments, for example.

Figure 2:
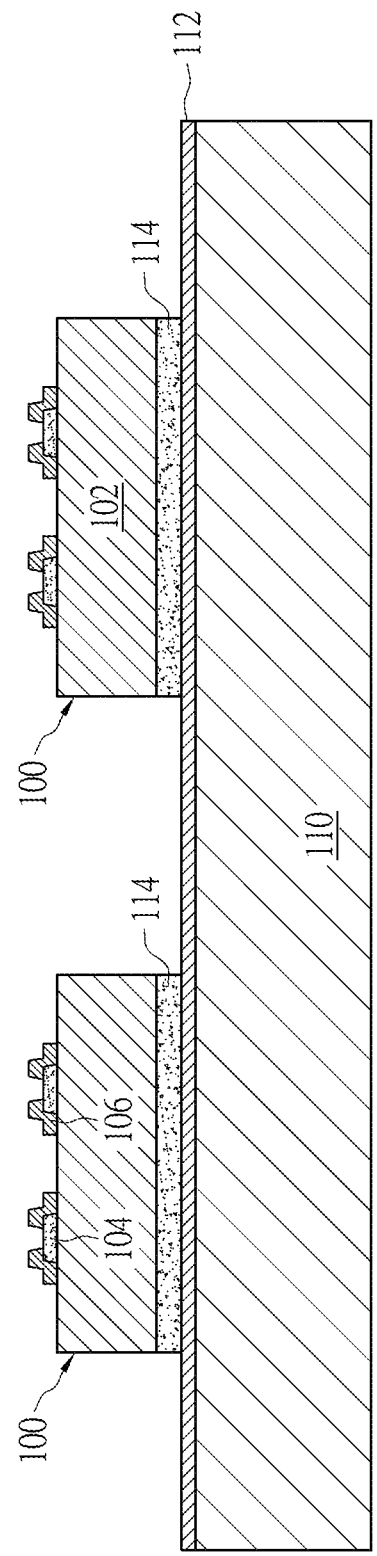
FIGS. 2 through 9 are cross-sectional views illustrating a method of packaging a semiconductor device at various stages in accordance with some embodiments.
Figure 3:
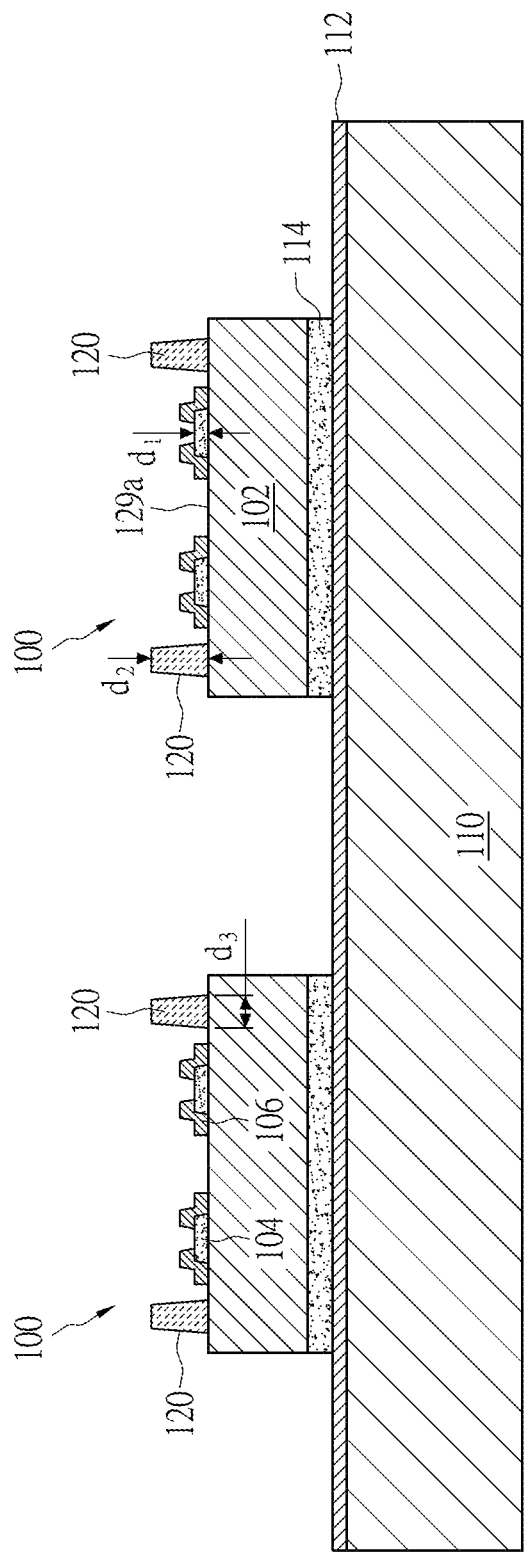
Figure 4:
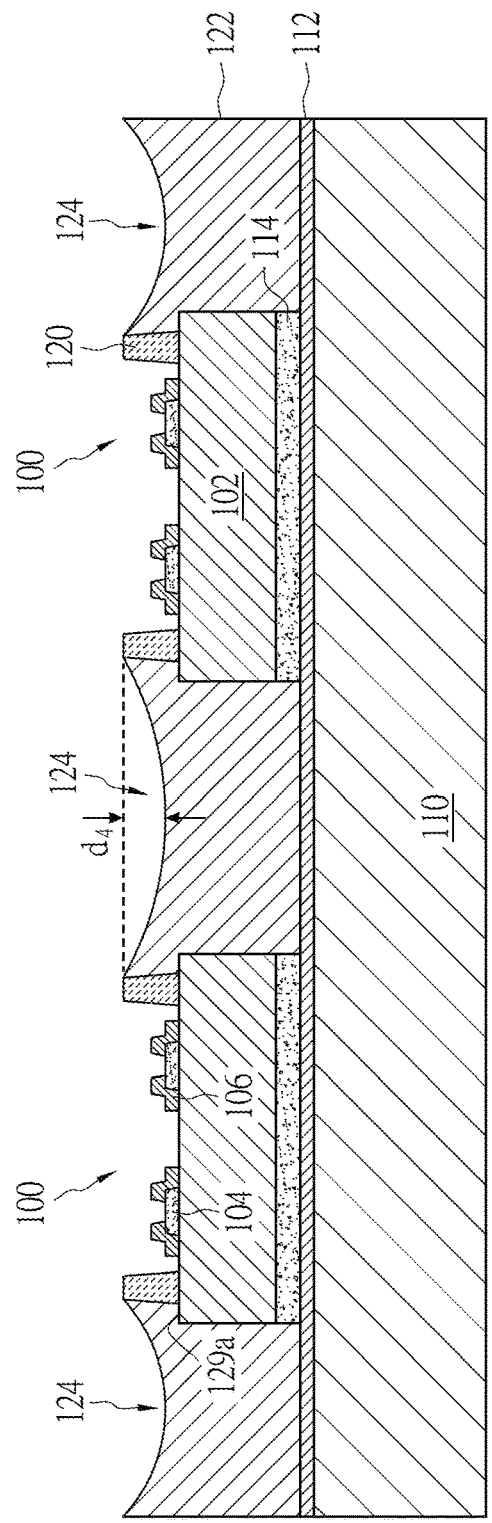
Figure 5:
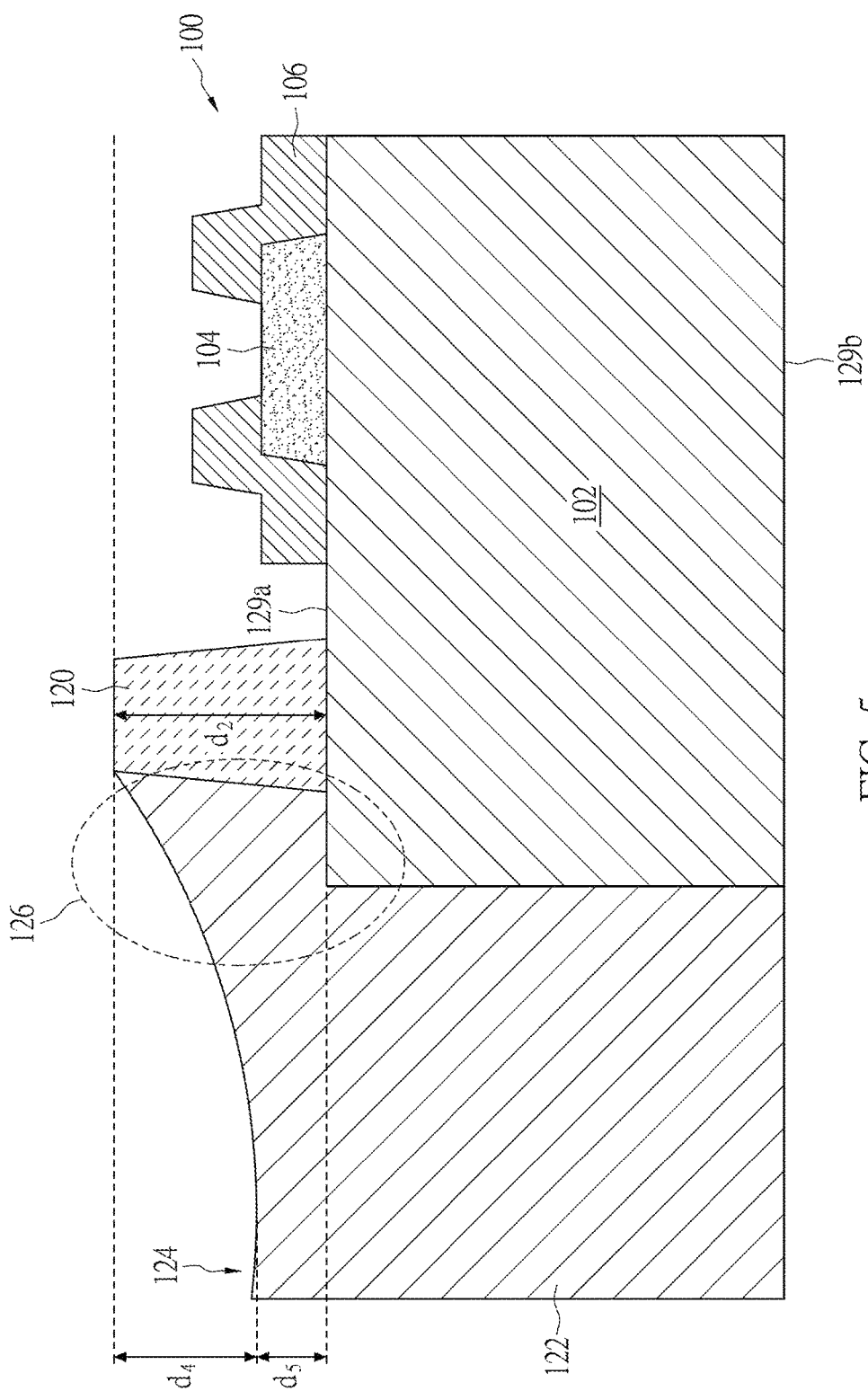

FIGS. 2, 3, 4, 6, 8, and 9 are cross-sectional views illustrating a method of packaging a semiconductor device at various stages in accordance with some embodiments. FIG. 5 is a more detailed view of a portion of FIG. 4, and FIG. 7 is a more detailed view of a portion of FIG. 6.

Referring next to FIG. 2, a plurality of dies 100 are coupled to a carrier 110. The integrated circuit dies 100 are coupled to the carrier 110, manually or using an automated machine such as a pick-and-place machine. The carrier 110 has a film 112 formed thereon in some embodiments. The film 112 comprises a light to heat conversion (LTHC) material or other materials, for example. In some embodiments, the film 112 is not included. The integrated circuit dies 100 are coupled to the carrier 110 using an adhesive or a die attach film (DAF) 114. The carrier 110 may comprise glass, silicon oxide, aluminum oxide, or a semiconductor wafer, as examples. The carrier 110 may also comprise other materials.

Figure 9:
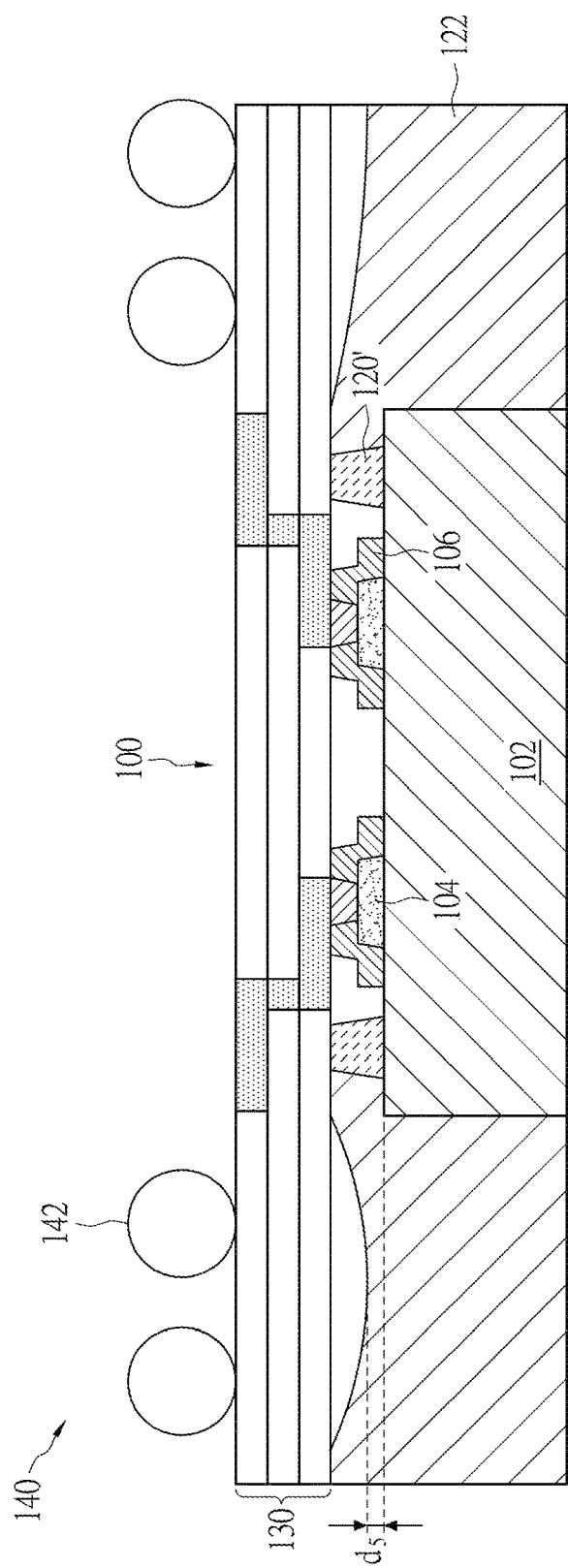

In some embodiments, the integrated circuit dies 100 are coupled to the carrier 110 and are packaged in individual packages (see FIG. 9). In other embodiments, two or more integrated circuit dies 100 can be packaged together (see FIG. 11). A plurality of integrated circuit dies 100 comprising the same or different functions may be packaged together in accordance with some embodiments, for example.

Referring next to FIG. 3, a novel dam structure 120 is disposed on a first surface 129a of the dies 100 in accordance with some embodiments of the present disclosure. The dam structure 120 is formed on each of the plurality of dies 100 proximate edge regions of the plurality of dies 100. The dam structure 120 is disposed around the plurality of contact pads 104 of each die 100 proximate edge regions of the integrated circuit dies 100. The plurality of contact pads 104 and the dam structures 120 are disposed on the first surfaces 129a of the integrated circuit dies 100. The contact pads 104 comprise a height or thickness comprising dimension $d_1$, wherein dimension $d_1$ comprises about 3 μm or less in some embodiments. Alternatively, the contact pads 104 may comprise other dimensions. Dimension $d_1$ is also referred to herein, e.g., in some of the claims, as a first height. The dam structure 120 comprises a seal ring structure formed at or close to each edge of the dies 100.

The dam structure 120 comprises a material such as polyimide (PI), polybenzoxazole (PBO), an underfill (UF) material, a patternable epoxy, an unremovable photoresist, a solder mask material, or combinations or multiple layers thereof in some embodiments. The dam structure 120 comprises an insulative material in some embodiments. Alternatively, the dam structure 120 may comprise a conductive or semiconductive material. The dam structure 120 comprises a ring formed around the dies 100 having a height or thickness comprising dimension $d_2$, wherein dimension $d_2$ comprises about 3 μm or greater in some embodiments. Dimension $d_2$ is greater than dimension $d_1$ of the contact pads 104 in some embodiments, for example. Dimension $d_2$ is also referred to herein, e.g., in some of the claims, as a second height. The sides of the ring-shaped dam structure 120 comprise a width comprising dimension $d_3$, wherein dimension $d_3$ comprises about 2 to 10 μm in some embodiments. Alternatively, the dam structure 120 may comprise other materials and dimensions.

In the embodiments shown in FIGS. 1A, 2, and 3, the dam structure 120 is attached to or formed on the dies 100 after the dies 100 are attached to the carrier 110. Forming the dam structure 120 is performed after coupling the plurality of dies 100 to the carrier 110, for example. Alternatively, the dam structure 120 may be attached to or formed on the dies 100 before the dies 100 are attached to the carrier 110, in other embodiments.

For example, an integrated circuit die 100 shown in FIG. 1B may be provided that already has a dam structure 120 formed thereon. The dam structure 120 can be formed on the integrated circuit die 100 while the dies 100 are still in wafer form, or after the dies 100 are singulated, for example. A plurality of the dies 100 including the dam structure 120 are then attached to a carrier 110, as shown in FIG. 3. Thus, in some embodiments, forming the dam structure 120 is performed before coupling the plurality of dies 100 to the carrier 110.

FIG. 1B also illustrates that the dam structures 120 can have tapered sidewalls or substantially straight sidewalls, as shown in phantom (e.g., in dashed lines) in FIG. 1B. In the other drawings of the present disclosure, dam structures 120 with tapered sidewalls are shown; however, alternatively, the dam structures 120 in each of the drawings may have substantially straight sidewalls. The tapered sidewalls of the dam structures 120 are wider at the bottom than at the top, whereas the substantially straight sidewalls have substantially the same width at the bottom and top, for example.

Whether the dam structures 120 are formed on the dies 100 after (FIGS. 1A, 2, and 3) or before (FIGS. 1B and 3) attaching the dies 100 to the carrier 110, the dam structures 120 may be formed on the dies 100 using an attachment process, a lithography process, a spin-on process, a deposition process, a lamination process, a process for forming a material layer of the plurality of dies 100, and/or a combination thereof, as examples. The dam structures 120 can be pre-formed or pre-fabricated and may be attached to the dies 100 using an adhesive, tape, lamination, or other substance. Alternatively, the dam structures 120 may be formed using a deposition process such as chemical vapor deposition (CVD), a spin-on process, lamination of the material of the dam structures 120, or other methods. The material is then patterned using a lithography process, direct etch process, or other methods, forming the dam structures 120 into the desired shape. The dam structures 120 may also be formed using other methods.

A molding material 122 is then disposed around the integrated circuit dies 100 and the dam structures 120, as shown in FIG. 4. The molding material 122 is formed over exposed portions of the carrier 110 (e.g., over the film 112 on the carrier 110), over the sidewalls of the integrated circuit dies 100, over exposed portions of the first surface 129a of the dies 100 outside the dam structure 120 proximate edge regions of the dies 100, and over sidewalls of the dam structure 120 that face away from a central region of the dies 100. The molding material 122 may be molded using, for example, compressive molding, transfer molding, or other methods. The molding material 122 encapsulates the integrated circuit dies 100 and dam structures 120, for example. The molding material 122 may comprise an epoxy, an organic polymer, or a polymer with or without a silica-based or glass filler added, as examples. In some embodiments, the molding material 122 comprises a liquid molding compound (LMC) that is a gel type liquid when applied. The molding material 122 may also comprise a liquid or solid when applied. Alternatively, the molding material 122 may comprise other insulating and/or encapsulating materials.

The dam structures 120 function as a seal ring during the application of the molding material 122. Thus, the molding material 122 extends to the top surfaces of the sidewalls of the dam structures 120 that face away from the central regions of the dies 100. The dam structures 120 also prevent the molding material 122 from reaching the top surfaces of the dies 100 in central regions of the dies 100, or reduce the amount of molding material 122 that reaches the top surfaces of the dies 100 in the central regions.

Next, the molding material 122 is cured using a curing process in some embodiments. The curing process may comprise heating the molding material 122 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 122 may be cured using other methods. In some embodiments, a curing process is not included.

During the curing process, the molding material 122 may shrink, as illustrated in FIG. 4. Due to a meniscus effect, the molding material 122 may shrink less proximate the dam structures 120 than in regions spaced apart from the dam structures 120, forming recessed regions 124. The amount of the recesses in the recessed region 124 may comprise a dimension $d_4$, wherein dimension $d_4$ comprises about 5 μm to about 15 μm in some embodiments, for example. Alternatively, dimension $d_4$ may comprise other values. The recessed regions 124 may also form as a result of the application process of the molding material 122, e.g., in embodiments wherein the molding material 122 is a liquid or gel as applied.

A more detailed cross-sectional view of a corner region 126 of the dies 100 is shown in FIG. 5. Advantageously, because of the inclusion of the dam structures 120 in the package, the corner of the substrate 102 of the die 100 is covered by the molding material 122. Even in the recessed region 124, an amount of the molding material 122 advantageously resides above and is disposed above the first surface 129a of the integrated circuit die 100 (e.g., disposed above the surface of the substrate 102 of the die 100. The amount of molding material 122 that is disposed above the first surface 129a of the integrated circuit die 100 comprises a dimension $d_5$, wherein dimension $d_5$ comprises about 2 μm to about 5 μm in some embodiments, for example. Alternatively, dimension $d_5$ may comprise other values. The molding material 122 disposed above the first surface 129a of the die 100 provides protection for the die 100 during the packaging process and during the subsequent formation of an interconnect structure. The molding material 122 is also disposed in the corner regions 126 and provides protection for the corners of the dies 100. The molding material 122 is substantially coplanar with a second surface 129b of the dies 100, wherein the second surface 129b is opposite the first surface 129a of the dies 100.

Figure 6:
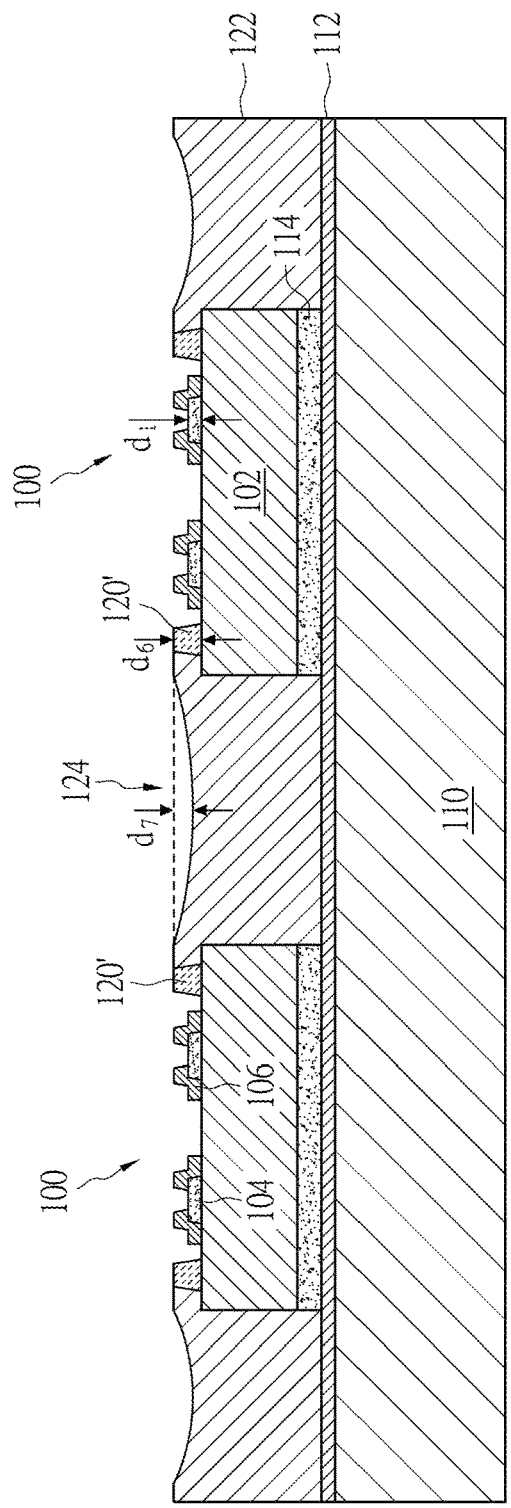
Figure 7:
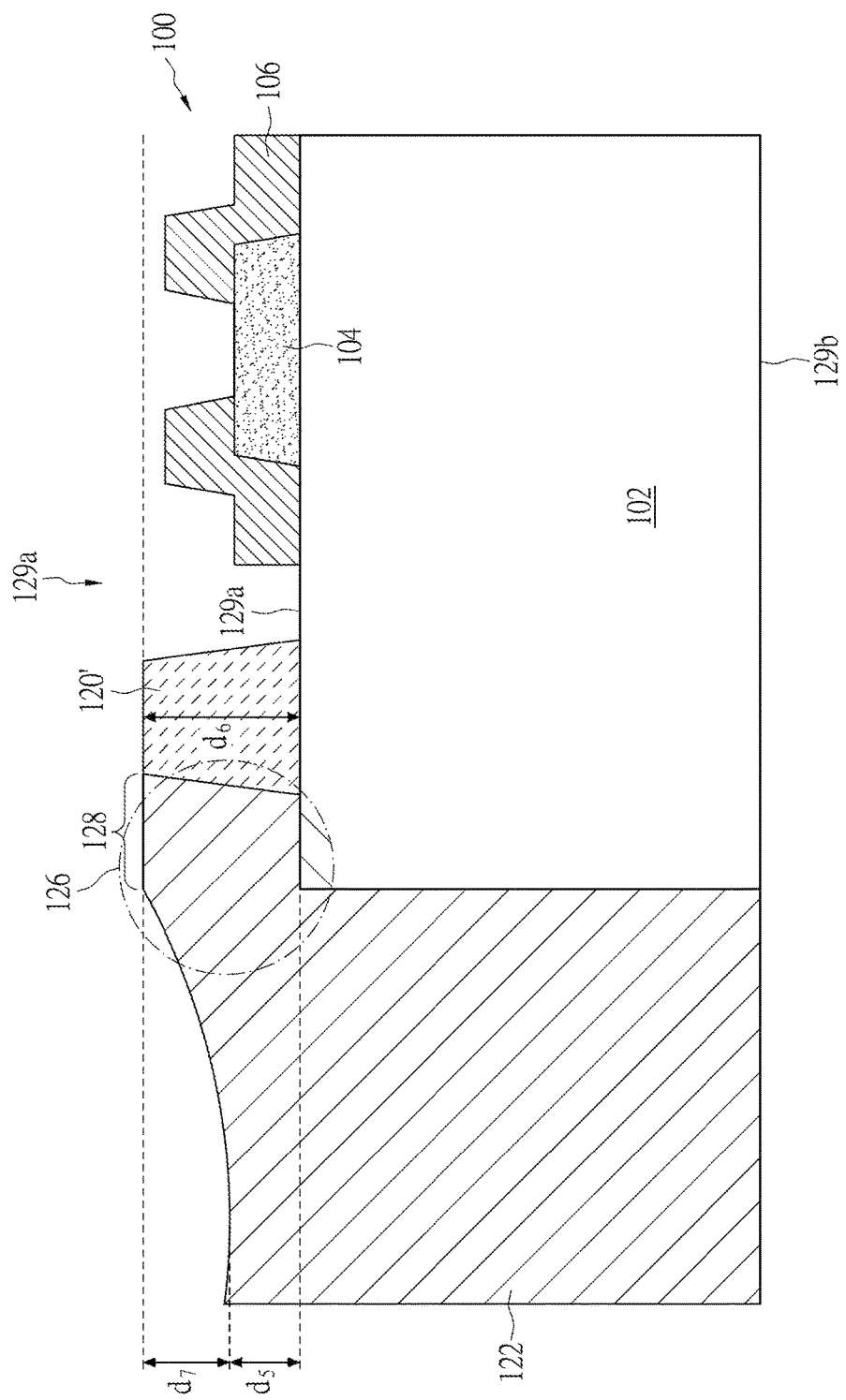

A top portion of the molding material 122 and a top portion of the dam structures 120 are then removed, as shown in FIG. 6. The dam structures 120 after the removal of the top portion of the dam structures 120 are labeled 120' in the drawings. The top portion of the molding material 122 and the top portion of the dam structures 120 are removed using a grinding process in some embodiments, for example. The grinding process may comprise a process similar to a sanding process that is used for wood, using a rotating sander, for example. The grinding process may comprise rotating a disk lined with an appropriate material or materials for grinding the materials of the molding material 122 and the dam structures 120 to a predetermined height, for example. The disk may be lined with diamond, for example.

In some embodiments, a chemical-mechanical polishing (CMP) process is used to remove the top portion of the molding material 122 and the top portion of the dam structures 120, for example. A combination of a grinding process and a CMP process may also be used. Alternatively, the top portion of the molding material 122 and the top portion of the dam structures 120 may be removed using other methods.

In some embodiments, the dam structures 120' after the grinding and/or CMP process comprise a height or thickness comprising dimension $d_6$, wherein dimension $d_6$ comprises about 1 μm to about 2 μm. Dimension $d_6$ is less than dimension $d_2$, for example. Dimension $d_6$ is greater than or about the same as dimension $d_1$ comprising the first height of the contact pads 104 in some embodiments. Alternatively, dimension $d_6$ may comprise other values and other relative values.

Dimension $d_6$ is also referred to herein, e.g., in some of the claims, as a second height or a third height. For example, when dimension $d_2$ is referred to as a second height which is the height of the dam structure 120 before the grinding and/or CMP process, dimension $d_6$ is referred to as and comprises a third height which is the height of the dam structures 120' after the grinding and/or CMP process. As another example, in comparing the first height of the contact pads 104 comprising dimension $d_1$ to the height of the dam structures 120' after the grinding and/or CMP process, dimension $d_6$ is referred to as and comprises a second height.

Removing the top portion of the molding material 122 and the top portion of the dam structures 120, which forms dam structures 120' having a reduced height, also advantageously results in a decrease in the amount of recesses in the recessed regions 124, relative to the top surfaces of the dam structures 120' with the reduced height. The recesses in the recessed regions 124 after the grinding and/or CMP process comprise a dimension $d_7$, wherein dimension $d_7$ comprises about 0 μm to about 10 μm, as examples. Dimension $d_7$ is less than dimension $d_4$, for example. In embodiments wherein dimension $d_7$ comprises 0, the recesses in the recessed regions 124 are advantageously completely removed, forming a substantially planar surface for the formation of an interconnect structure. Alternatively, dimension $d_7$ may comprise other values and other relative values.

A more detailed cross-sectional view of a corner region 126 of FIG. 6 is shown in FIG. 7. In some embodiments, removing the top portion of the molding material 122 comprises removing a portion of the molding material 122 proximate the dam structures 120'. In some embodiments, removing the top portion of the molding material 122 results in the molding material 122 being substantially coplanar with the top surfaces of the dam structures 120' after the grinding and/or CMP process in regions 128 proximate the dam structures 120'. The molding material 122 comprises substantially dimension $d_6$ after the grinding and/or CMP process. Thus, the molding material 122 substantially comprises dimension $d_6$ comprising the second height of the dam structures 120', proximate the dam structures 120', after the grinding and/or CMP process used to remove the top portion of the molding material 122 and the top portion of the dam structure 120, for example.

Figure 8:
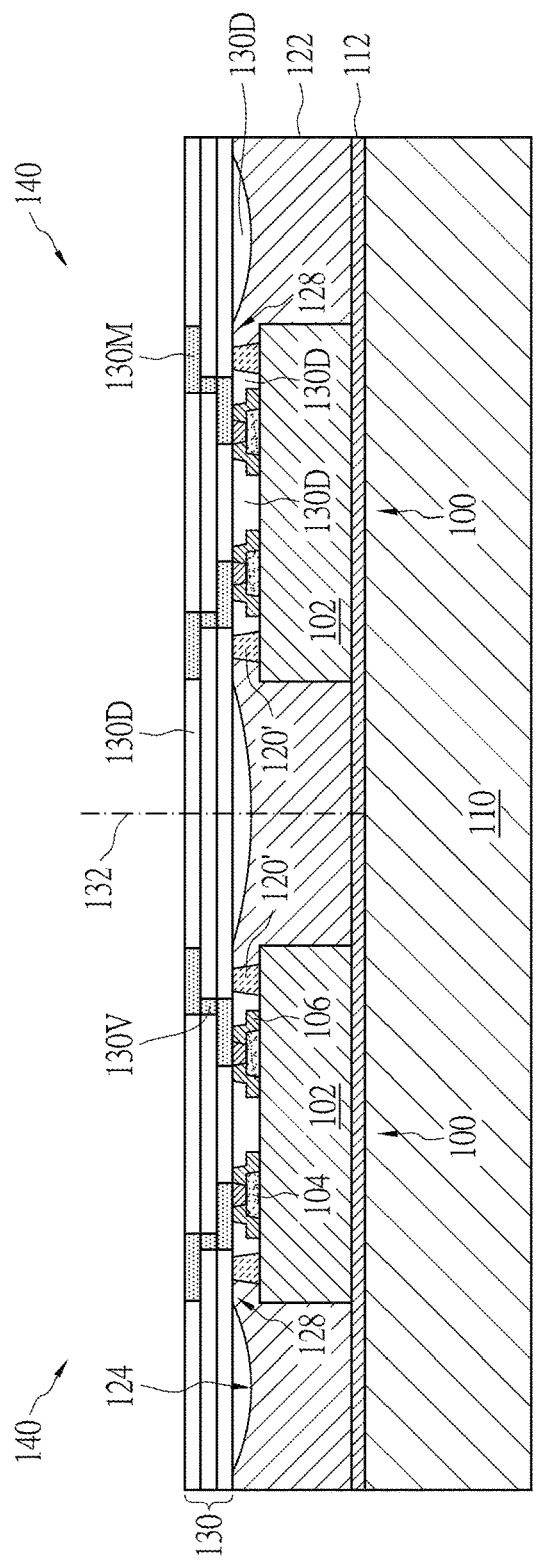

Referring next to FIG. 8, an interconnect structure 130 is then formed over the carrier 110; e.g., the interconnect structure 130 is formed over the molding material 122 and the dies 100. The interconnect structure 130 comprises a post-passivation interconnect (PPI) structure or a redistribution layer (RDL) in some embodiments, for example. The interconnect structure 130 includes fan-out regions that expand a footprint of contact pads 104 on the dies 100 to a larger footprint for the package in some embodiments, for example.

The interconnect structure 130 includes a plurality of dielectric layers 130D and metal lines 130M and/or metal vias 130V formed inside the dielectric layers 130D to provide an electrical connection to contact pads 104 on the substrate 102. The dielectric layers 130D may be formed, for example, of a low dielectric constant (low-K) dielectric material, such as phosphosilicate glass (PSG), borophosphosilicate glass (BPSG), fluorinated silicate glass (FSG), SiOxCy, spin-on-glass, spin-on-polymers, silicon carbon material, compounds thereof, composites thereof, combinations thereof, or the like, by any suitable method, such as spinning, CVD, and/or plasma-enhanced CVD (PECVD). The conductive lines 130M and conductive vias 130V may comprise copper, copper alloys, other metals or alloys, or combinations or multiple layers thereof, as examples. The conductive lines 130M and vias 130V may be formed using subtractive and/or damascene techniques, as examples.

The recessed regions 124 are filled with insulating material of one of the dielectric layers 130D. Likewise, regions over the substrate 102 between the dam structures 120', contact pads 104, and insulating material 106 are filled with insulating material of one of the dielectric layers 130D.

The carrier 110 and film 112 is removed, and the packaged semiconductor devices 140 are singulated or diced on scribe line regions 132 to form a plurality of packaged semiconductor devices 140, as shown in FIG. 9. The molding material 122 and the interconnect structure 130 are diced along the scribe lines 132 to form the plurality of packaged semiconductor devices 140 in some embodiments, for example.

One die 100 is packaged in the embodiments shown in FIG. 9, for example. Alternatively, two or more dies 100 can be packaged in a packaged semiconductor device 140', as shown in FIG. 11, to be described further herein.

FIG. 9 also illustrates that a plurality of connectors 142 can be coupled to portions of the interconnect structure 130 in some embodiments. The top-most layer of the interconnect structure 130 may include contact pads (not shown) formed thereon, and the connectors 142 are coupled to the contact pads, for example. The connectors 142 may comprise a eutectic material such as solder, for example. The eutectic material may comprise solder balls or solder paste in some embodiments that are arranged in a ball grid array (BGA) or other arrangements. The eutectic material is reflowed by heating the eutectic material to a melting temperature of the eutectic material, and the eutectic material is then allowed to cool and re-solidify, forming connectors 142. The connectors 142 may include other types of electrical connectors, such as microbumps, controlled collapse chip connection (C4) bumps, or pillars, and may include conductive materials such as Cu, Sn, Ag, Pb, or the like. In some embodiments, the connectors 142 may comprise joined bumps, as another example. In some embodiments, connectors 142 are not included on the package.

Figure 10:
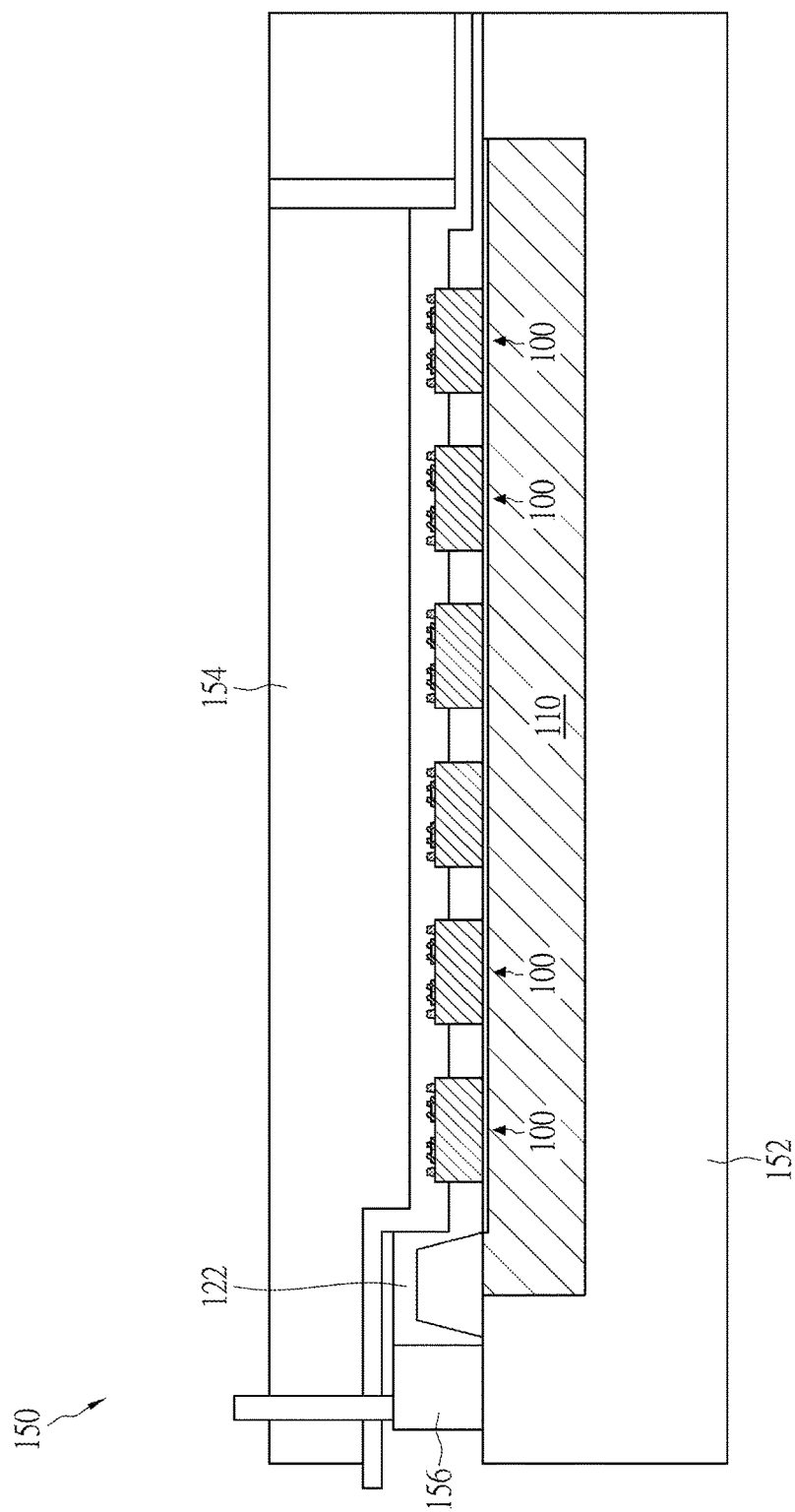
FIG. 10 is a cross-sectional view of a molding material formation process in accordance with some embodiments.

FIG. 10 is a cross-sectional view of a molding tool 150 that illustrates a molding material 122 formation process in accordance with some embodiments. To form the molding material 122, the carrier 110 with a plurality of dies 100 attached thereto is placed on a bottom mold chase 152 of the molding tool 150. The molding material 122 in a gel, liquid, or solid form is placed on a loading port of the tool 150, and a top mold chase 154 with release film clamps is placed over the carrier 110. A vacuum of the tool 150 is turned on, and plungers 156 are activated to push the molding material 122 and inject it to fill the mold chases 152 and 154 with the molding material 122. The molding material 122 is then cured or allowed to cure, the top mold chase 154 is opened, and the carrier 110 is removed from the bottom mold chase 152.

Figure 11:
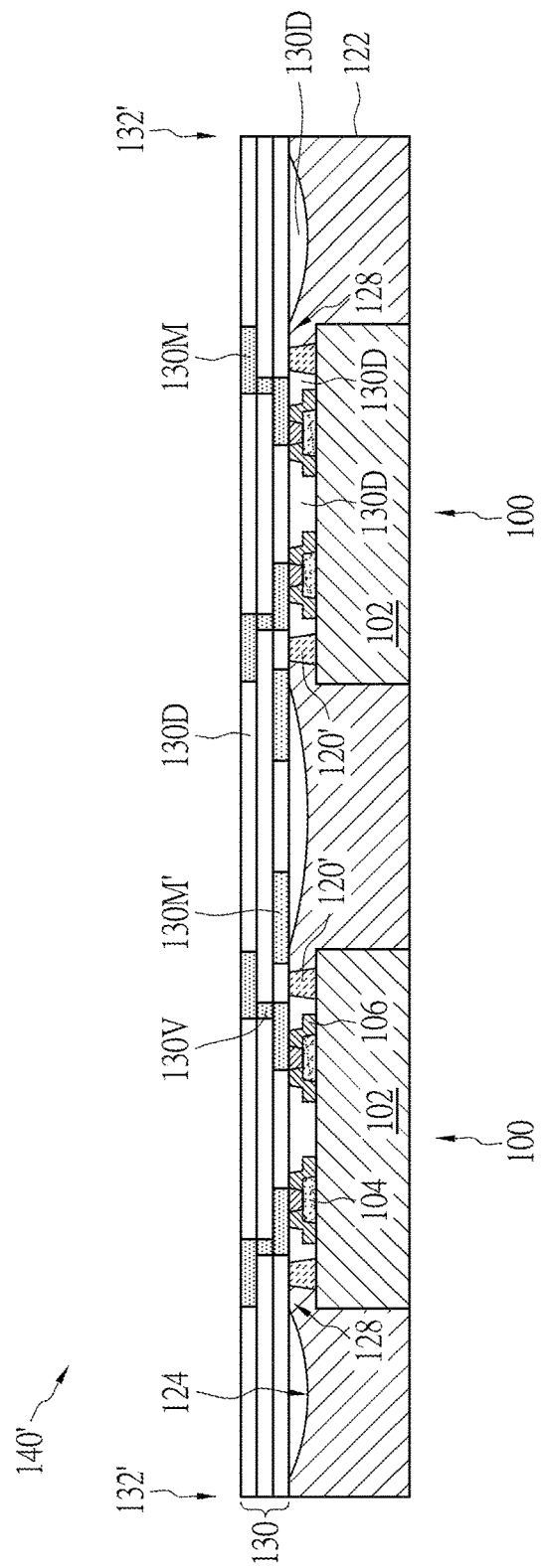
FIG. 11 illustrates a cross-sectional view of a packaged semiconductor device in accordance with some embodiments.

FIG. 11 illustrates a cross-sectional view of a packaged semiconductor device 140' that includes a plurality of integrated circuit dies 100 packaged together, in accordance with some embodiments. Two or more integrated circuit dies 100 can be packaged together using the methods described herein and then singulated at scribe lines 132' to form the packaged semiconductor device 140'. Portions of the interconnect structure 130 provide horizontal electrical connections for the integrated circuit dies 100. For example, some of the conductive lines 130M' and vias 130V may comprise wiring between the two or more dies 100. Connectors 142 (see FIG. 9) may or may not be coupled to portions of the interconnect structure 130.

Figure 12B:
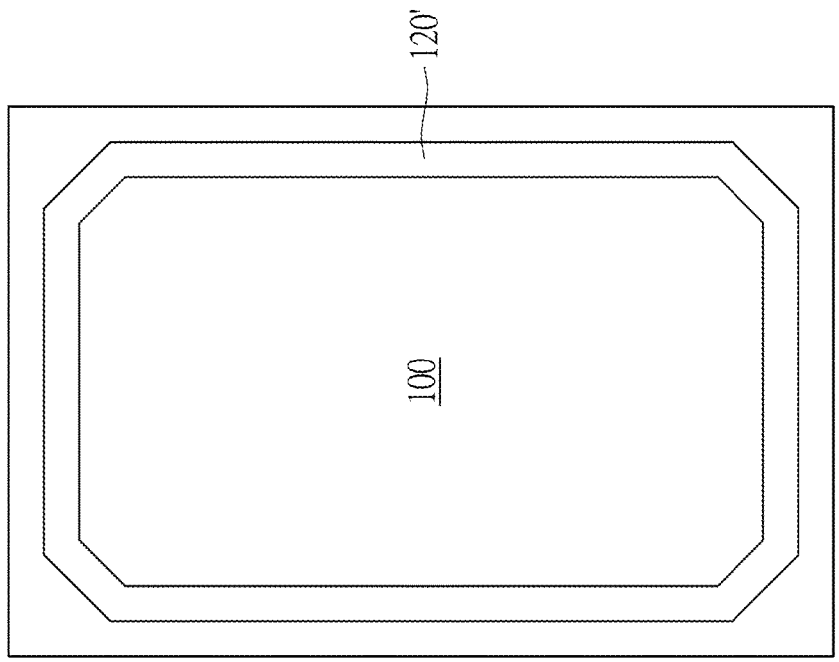
FIGS. 12A and 12B are top views illustrating a dam structure formed on an integrated circuit die in accordance with some embodiments.
Figure 12A:
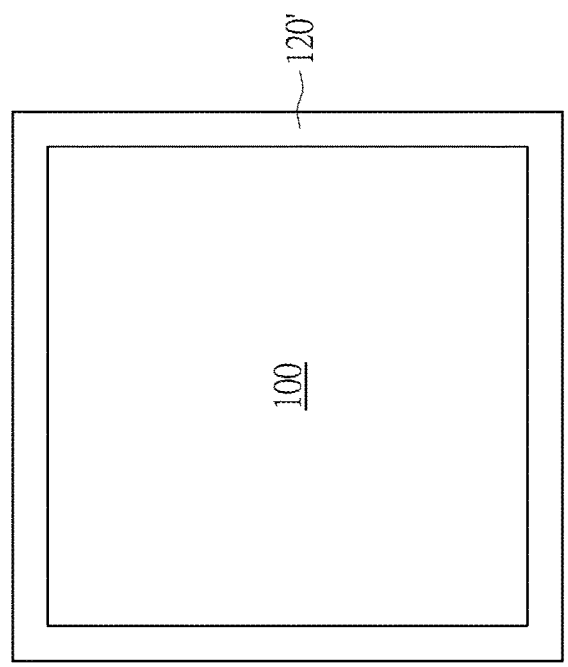

FIGS. 12A and 12B are top views illustrating a dam structure 120' formed on an integrated circuit die 100 in accordance with some embodiments. The dies 100 are typically square or rectangular in shape. In FIG. 12A, the die 100 is square, and the dam structure 120' is formed directly on the edges of the die 100. The dam structure 120' comprises a substantially square ring shape that follows the shape of the die 100. In FIG. 12B, the die 100 is rectangular, and the dam structure 120' is also substantially rectangular in shape. However, the dam structure 120' is located proximate the edges of the die 100 yet spaced apart from the edges of the die 100 by a predetermined distance. The dam structure 120' may be spaced apart from the edges of the die 100 by a few μm in some embodiments, for example. FIG. 12B also illustrates that the corners of the dam structure 120' may not be square, but may comprise other shapes, such as angled. The corners of the dam structure 120' may alternatively be rounded or other shapes. The dies 100 and dam structures 120' may also comprise other shapes and relative shapes and dimensions, for example.

Some embodiments of the present disclosure include methods of packaging semiconductor devices. Other embodiments include packaged semiconductor devices that have been packaged using the novel methods described herein.

Some advantages of embodiments of the present disclosure include providing packaging methods that include a novel design for molding material coverage. The dam structures result in more molding material being applied proximate the dies, so that corner regions of the dies are protected by the molding material. Reducing the height of the dam structures using the grinding and/or CMP process results in reducing or eliminating recesses in the molding material top surface. The improved planarity of the molding material top surface results in an improved surface for the formation of the interconnect structure, which results in improved device performance and packaging yields. The dam structures also reduce or prevent overflow of the molding material onto the die surface during the molding material application process. Furthermore, the novel packaging methods and structures described herein are easily implementable in manufacturing and packaging process flows.

In some embodiments, a method of packaging a semiconductor device includes forming a dam structure on a plurality of dies proximate edge regions of the plurality of dies, disposing a molding material around the plurality of dies, and removing a top portion of the molding material and a top portion of the dam structure.

In some embodiments, a method of packaging a semiconductor device includes coupling a plurality of dies to a carrier, forming a dam structure on each of the plurality of dies proximate edge regions of the plurality of dies, and disposing a molding material over the carrier around the plurality of dies. The method includes removing a top portion of the molding material and a top portion of the dam structure, and forming an interconnect structure over the plurality of dies and the molding material. The carrier is removed, and the molding material and the interconnect structure are singulated to form a plurality of packaged semiconductor devices.

In other embodiments, a packaged semiconductor device includes an integrated circuit die including a plurality of contact pads and a dam structure disposed thereon, the dam structure being disposed around the plurality of contact pads proximate edge regions of the integrated circuit die. A molding material is disposed around the integrated circuit die and the dam structure. An interconnect structure is disposed over the integrated circuit die and the molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaged semiconductor device, comprising:
   an integrated circuit die including a dam structure and a plurality of contact pads disposed thereon, the dam structure being disposed around the plurality of contact pads proximate edge regions of the integrated circuit die;
   a molding material disposed along sidewalls of the integrated circuit die and along sidewalls of the dam structure, the plurality of contact pads being free of the molding material; and
   an interconnect structure disposed over the integrated circuit die and the molding material.

2. The packaged semiconductor device of claim 1, wherein the plurality of contact pads comprises a first height, and wherein the dam structure comprises a second height, the second height being greater than or about the same as the first height.

3. The packaged semiconductor device of claim 2, wherein the molding material comprises substantially the second height over the integrated circuit die proximate the dam structure.

4. The packaged semiconductor device of claim 1, wherein the integrated circuit die comprises a first surface and a second surface opposite the first surface, wherein the plurality of contact pads and the dam structure are disposed on the first surface of the integrated circuit die, wherein the molding material is disposed above the first surface of the integrated circuit die, and wherein the molding material is substantially coplanar with the second surface of the integrated circuit die.

5. The packaged semiconductor device of claim 1, wherein the dam structure comprises a material selected from the group consisting essentially of polyimide (PI), polybenzoxazole (PBO), underfill (UF) material, patternable epoxy, unremovable photoresist, solder mask material, and combinations thereof.

6. The packaged semiconductor device of claim 1, wherein the dam structure comprises a seal ring structure.

7. The packaged semiconductor device of claim 1, wherein the dam structure comprises substantially straight sidewalls or tapered sidewalls.

8. The packaged semiconductor device of claim 1, wherein the integrated circuit die is one of a plurality of the integrated circuit dies, wherein the molding material is disposed around and between the plurality of integrated circuit dies, and wherein the interconnect structure is disposed over the plurality of integrated circuit dies and the molding material.

9. The packaged semiconductor device of claim 1, wherein a surface of a portion of the molding material immediately adjacent the dam structure is planar.

10. A packaged semiconductor device, comprising:
    an integrated circuit die, the integrated circuit die having a contact pad on a first surface;
    a dam structure disposed on the first surface of the integrated circuit die, the dam structure being interposed between the contact pad and an edge of the integrated circuit die;
    a molding material disposed along a first sidewall of the dam structure and an edge of the integrated circuit die; and
    an interconnect structure disposed over the integrated circuit die and the molding material, the interconnect structure comprising a first dielectric layer, the first dielectric layer extending along a second sidewall of the dam structure, the first sidewall being an opposite sidewall of the second sidewall of the dam structure.

11. The packaged semiconductor device of claim 10, wherein an upper surface of the molding material comprising a concave surface, the first dielectric layer extending along the concave surface of the molding material.

12. The packaged semiconductor device of claim 11, wherein a depth of the concave surface is less than 10 µm.

13. The packaged semiconductor device of claim 10, wherein the first dielectric layer extends between the dam structure and the contact pad.

14. The packaged semiconductor device of claim 10, wherein at least a portion of an upper surface of the molding material is coplanar with an upper surface of the dam structure.

15. The packaged semiconductor device of claim 10, wherein the molding material extends to an uppermost surface of the dam structure.

16. The packaged semiconductor device of claim 10, wherein a height of the dam structure is greater than a height of the contact pad.

17. A packaged semiconductor device, comprising:
    an integrated circuit die including a contact pad on a first surface of the integrated circuit die;
    a dam structure disposed on the first surface of the integrated circuit die, the dam structure being interposed between the contact pad and an edge of the integrated circuit die;
    a molding material disposed along sidewalls of the dam structure and the integrated circuit die, an upper surface of the molding material having a first portion and a second portion, the first portion being level with an upper surface of the dam structure, the second portion being concave; and an interconnect structure disposed over the integrated circuit die and the molding material.

18. The packaged semiconductor device of claim 17, wherein the molding material extends along sidewalls and an upper surface of the integrated circuit die.

19. The packaged semiconductor device of claim 17, wherein the interconnect structure comprises a first dielectric layer, the first dielectric layer extending along a sidewall of the dam structure opposite the molding material.

20. The packaged semiconductor device of claim 17, wherein a thickness of the molding material above the integrated circuit die is equal to a thickness of the dam structure above the integrated circuit die.

* * * * *